United States Patent

Christensen et al.

[15] 3,649,283

[45] Mar. 14, 1972

[54] PROCESS FOR APPLYING PHOTORESIST

[72] Inventors: Carl W. Christensen; Calvin M. Isaacson, both of Beverly, Mass.

[73] Assignee: Shipley Company, Inc., Newton, Mass.

[22] Filed: Oct. 29, 1969

[21] Appl. No.: 872,133

Related U.S. Application Data

[63] Continuation-in-part of Ser. No. 823,052, May 8, 1969.

[52] U.S. Cl. ....................96/85, 96/83

[51] Int. Cl. ....................G03c 1/86

[58] Field of Search ....................96/363, 36, 83, 85

[56] References Cited

UNITED STATES PATENTS

| | | | |
|---|---|---|---|
| 3,488,191 | 1/1970 | O'Donnell | 96/83 |
| 3,310,403 | 3/1967 | Bryan | 96/36.3 |
| 2,614,932 | 10/1952 | Nadeau | 96/83 |
| 2,612,446 | 9/1952 | Umberger | 96/83 |
| 3,143,414 | 8/1964 | Yackel et al. | 96/36 |
| 3,168,402 | 2/1965 | Branibar | 96/83 |
| 3,183,092 | 5/1965 | Mackey et al. | 96/83 |

*Primary Examiner*—Norman G. Torchin
*Assistant Examiner*—Edward C. Kimlin
*Attorney*—Roberts, Cushman & Grover

[57] ABSTRACT

This invention is for a process for applying a smooth uniform layer of a photoresist to a base material. In the process, a laminate is provided comprising a layer of light-sensitive photoresist, a permeable backing layer and an intermediate layer displaced between the light-sensitive photoresist layer and the backing layer, the intermediate layer being soluble or degradable in water or developer for the light-exposed photoresist of the laminate. In use, this laminate with the light-sensitive photoresist layer face downward is adhered to a base material and washed with a solvent for the intermediate layer. The solvent permeates and undercuts the backing layer thereby solvating the intermediate layer, and breaking the bond between the backing layer and the light-sensitive layer. The backing layer may then be peeled from the photoresist layer. If the backing layer transmits light, the composite comprising the base material and the laminate may be exposed prior to the washing step and the washing step may be performed with a developer for the light-exposed light-sensitive photoresist layer. A preferred backing layer is clay filled paper having a smooth, glazed surface. An adhering agent may be applied over the photoresist layer if desired.

15 Claims, 6 Drawing Figures

PROCESS FOR APPLYING PHOTORESIST

CROSS-REFERENCE TO RELATED APPLICATION

This is a continuation-in-part of a copending U.S. Pat. application, Ser. No. 823,052 filed May 8, 1969.

BACKGROUND OF THE INVENTION

1. Field of the Invention

This invention relates to the application of photosensitive coatings, e.g., photoresists, to substrates such as circuit board base material used in the production of circuit boards, and more particularly, to a new process useful therefor.

2. Description of the Prior Art

Photosensitive resists are thin coatings which, when exposed to light of the proper wavelength, are chemically changed in their solubility characteristics to certain solvents (developers). Two types are available, negative-acting and positive-acting. The negative-acting resist is initially a mixture which is soluble in its developers, but after light exposure, undergoes chemical change and becomes insoluble in the developer. Exposure is done through a film pattern. The unexposed photoresist is selectively dissolved, softened, or washed away, leaving the desired resist pattern on the laminate. Positive-acting resists work in the opposite manner, light exposure making the polymer mixture soluble in the developer. The resist image is frequently dyed to make it visible for inspection and retouching. The resist pattern that remains after the development (and post-baking in some cases) is insoluble and chemically resistant to cleaning, plating, and etching solutions used in photoengraving processes. Typical examples of positive-acting photosensitive materials are the naphtho-quinone (1,2)-diazide sulfonic acid esters disclosed in U.S. Pat. No. 3,046,118. Other photosensitive materials are known in the prior art.

Processes involving the formation of coatings of photoresist such as in the formation of printed circuit boards are known. In one process, a metal-clad base sheet is coated with a photoresist, for example, of the diazo-Novolak resin type, and the photoresist is exposed through a positive or negative of the desired image. The light-exposed areas of the resist are rendered alkali soluble by exposure, and they are washed with developer to leave the underlying metal layer exposed. An acid, to which the resist is impervious, may be used to etch away the exposed metal, or selective plating or other process may be accomplished and there remains a layer in the desired image pattern. The remaining resist may or may not be removed as desired.

In connection with processes for making printed circuit boards is the provision for and plating of through holes. These holes extend between opposite surfaces of the base sheet and are used to form an electrical connection between both surfaces. Typically they may be catalyzed and plated with an electroless plating solution.

The surface coating of the resist necessary to the above processes has been applied to circuit board base materials in the past by using squeegees, rollers or wicks or by dipping, to form a layer of liquid resist on the base material, followed by solidification of the resist. A number of drawbacks attend these liquid methods of application:

First, the resist is frequently forced into the through-holes, where it (a) may not become sufficiently exposed to become soluble, or (b) may not be dissolved in a reasonable time. In either event, the presence of a residuum of resist in the through-holes prevents proper plating.

An additional technique for applying photoresist has been developed. The resist is first coated as a film on a backing sheet, and while still on the backing sheet, the film is adhered by means of heat and/or pressure to the substrate. The backing sheet may be transparent and the film may be exposed through the sheet. Before developing the photoresist, the backing sheet is removed. A process of this nature is disclosed in British Pat. No. 1,128,850 incorporated herein by reference. Although this technique solves some of the problem heretofore mentioned, such as plugging of through-holes, and provides a sufficiently thick coating of photoresist, it introduces additional problems and disadvantages of its own. For example, the range of useful materials is limited because the heat used to apply the photoresist degrades many types of desirable photoresists, and moreover, requires that the backing layer be of a material providing uniform and adequate heat transfer. As a practical matter, bonds are inferior because substrate surfaces are uneven with many minute, irregular hills and valleys, and heat-bonding of the photoresist film fails to produce enough plasticity to cause the film to do more than to bond to the hills and leave voids in the valleys unless the substrate is first subjected to a costly cleaning process. Such air pockets naturally limit the resolution of the images which can be formed with the photoresist, since they permit edge seepage of etchant, and may at times produce an inadequate bond.

An additional problem is that of sensitivity of the process to variation in parameters encountered in expected use. Because the process relies on heat on the photoresist film, it is subject to change whenever different photoresists, substrates or backing sheets are used because of different heat transfer characteristics thereof. Likewise, the high pressure required for bonding, which is provided by pressure rolls, creates problems in adapting to different substrate thicknesses. Similarly, substrate surface irregularities and inaccurate or biased feed of the photoresist film and substrate often causes lateral forces on the resist and eventual wrinkling of the resist to relieve the forces before or during bonding.

Finally, because the backing layer must be stripped from the photoresist layer, the physical characteristics of the photoresist layer become critical. For example, it has been found that thick photoresist layers—i.e., 1 mil or more, are necessary to avoid tearing. This results in substantially greater cost and poorer resolution of developed images. Moreover, the photoresist film may not be brittle or it will fracture. This requires careful compounding of the light-sensitive compound with various compatible resin systems.

In commonly assigned copending U.S. application, Ser. No. 799,259, an improved process is disclosed for applying photoresist to a substrate which overcomes the majority of the problems of the prior art noted above. The process comprises applying the photoresist to the surface of the substrate by first applying a liquid adhering agent, preferably a solvent for the resist containing a small amount of the dissolved resist, e.g., 0.5 to 5 percent by weight, to the substrate surface, and then bringing the surface into contact with a transfer sheet having a backing or support layer releasably secured to a uniform solidified layer of resist, whereby the layer of resist becomes surface softened and then adheres to the substrate. Afterwards, the backing layer of the transfer sheet is withdrawn to leave behind a uniform resist layer secured to the substrate.

The process of said application is an improvement over the prior art. However, because the photoresist layer adheres to both the circuit board surface and the backing layer, relative adherences are a problem and stripping the backing layer may result in some void formation in the photoresist film. This is found to be a problem where particles of dirt are present on the board surface and in the areas immediately adjacent through-holes in the board.

In copending U.S. Pat. application, Ser. No. 823,052, a further improvement in the art of applying photoresist layers is disclosed. According to this application, a laminate is provided comprising a layer of photoresist and a backing substrate. The materials of the photoresist and the backing layer are selected so that the resist is insoluble in a solvent for the backing. The laminate with the photoresist layer face downward is adhered to a base material, preferably a circuit board base material which may be either clad with a metal such as copper or unclad, and the backing layer is washed from the composite so formed with a solvent that will not solvate or affect the photoresist thereby leaving a uniform layer of photoresist adhered to the substrate. In a preferred embodiment, the laminate comprises a water insoluble photoresist material and a water soluble backing, preferably a water soluble paper comprising carboxymethyl cellulose. By the process of this invention, the backing layer is not torn or stripped from the photoresist layer. Consequently, the resist coating on a circuit board base material is free of voids and is uniform.

SUMMARY OF THE INVENTION

The invention herein disclosed is an alternative to that of copending application, Ser. No. 823,052. According to the invention, a laminate is provided comprising a layer of light-sensitive photoresist, a permeable backing layer, and an intermediate layer displaced between said light-sensitive photoresist layer and said backing layer, the intermediate layer being soluble in water or developer for the light-exposed photoresist of the laminate. The photoresist layer is adhered to the backing layer through the intermediate layer. In use, the laminate, with the photoresist layer face downward is adhered to a base material, preferably a circuit board base material which may be clad with a metal such as copper or unclad, and the composite so formed is washed with a solvent for the intermediate layer. The solvent permeates and undercuts the backing layer and solvates the intermediate layer. This breaks the bond between the resist and backing layers thereby permitting facile removal of the backing layer leaving behind a smooth, uniform layer of resist on the base material. If the backing layer transmits light, the composite comprising the base material and laminate may be exposed prior to washing thus permitting washing with a developer for the light-exposed, light-sensitive photoresist layer. The laminate may be adhered to the base material by any method known to those skilled in the art including the use of an adhering agent as disclosed in the above noted copending U.S. Pat. application, Ser. No. 799,259, by application of heat and pressure according to the methods disclosed in British Pat. No. 1,128,850 or by use of an adhering agent as a separate layer applied over the photoresist layer.

By the process of the invention, the backing layer is not torn from the photoresist layer. Consequently the resist coating on the circuit board base material is free of voids and is uniform. Moreover, the selection of the photoresist material and its thickness is not critical making the process simple, reliable and inexpensive to use. Through-holes in the board are not filled with resist but are bridged by the resist layer. Where the photosensitive laminate is adhered to a base material by the process of copending patent application, Ser. No. 779,257, the advantages of that invention are also included in the subject invention. For example, the categories of substrate and resists which can be used together are expanded because the importance of mutual thermal characteristics are minimized and the process is easy to control without maintaining a number of critical parameters.

DESCRIPTION OF THE PREFERRED EMBODIMENTS

Figure 1:
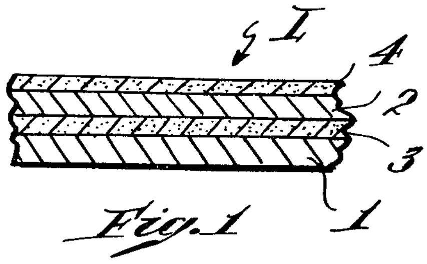
FIG. 1 is an enlarged cross section of a photosensitive laminate prepared in accordance with a preferred embodiment of the invention.

In FIG. 1 of the drawings, there is illustrated a laminate L prepared in accordance with a preferred embodiment of this invention. The laminate comprises a permeable backing layer 1, a photoresist layer 2, an intermediate layer 3, and a heat and/or pressure sensitive adhering layer 4.

The expression "permeable backing layer," as used throughout this specification, is intended to include within its scope flexible films having requisite strength properties that are somewhat permeable to liquids such as water. They need not be highly porous, but merely wetted throughout by a solvent for the intermediate bonding layer. Excluded from the scope of the definition of the backing layer are materials that are soluble in a solvent for the intermediate layer 3.

Flexible polymer film made permeable by methods known in the prior art such as by addition of various particulate inorganic salts followed by leaching are suitable materials for backing layer 1. Representative examples of suitable polymers include polystyrene and its alloys and copolymers such as acrylonitrile-butadiene-styrene (ABS) copolymers, cellulose acetate, cellulose propionate, ethyl cellulose, polymethyl methacrylate, polycarbonate, polyamides, polyester terephthates, polyvinyl alcohol, regenerated cellophane, ethylene oxide polymers, polyvinyl pyrrolidone, and the like. Also, included within the scope of the backing materials are paper and the nonwoven fabrics and papers formed from the above polymers. Most preferred for purposes of the invention is ordinary wet strength paper filled with clay and glazed for a smooth surface.

The expression "permeable" as used to describe the backing layer is intended to mean that the solvent for the intermediate layer is capable of passing through the backing layer, to some extent at least, or wet the backing layer to thereby solvate the intermediate layer. Pore size is not critical, and for most applications, slightly permeable materials are satisfactory as the solvent also undercuts the backing layer (seeps between the backing and resist layers) thereby solvating the intermediate layer.

The intermediate layer 3 should be one capable of acting as a bonding agent and barrier with good surface finish between the resist layer and the backing layer. A firm, strong bond is preferable. In addition, the intermediate layer is solvated by water or developers for the light-exposed resist layer. Finally, it must form a flexible film. Suitable materials for the intermediate layer include dextrine, gum arabic, mesquite gum, water soluble salts of the group consisting of polyvinyl ether-maleic anhydride copolymers, pectic acid and alginic acid, water soluble cellulose ether, water soluble salts of carboxy alkyl cellulose, water soluble salts of carboxy alkyl starch, glue, albumen, peptin, water soluble caseinate, polyvinylalcohol, polyvinyl pyrrolidone, polyacrylamide, water soluble salts of polyacrylic acid, gelatin, starches, ethylene oxide polymer, and high molecular weight saccharides. Other materials will, of course, be apparent to those skilled in the art.

In addition to the layers comprising the laminate discussed above, the photoresist layer may be provided with a protective layer such as paper for shipping purposes.

The photoresist layer 2 comprises a resist material preferably in a polymeric binder. Most available prior art positive and negative photoresists are suitable for the invention. They need only to be coatable on the backing layer and readily separable therefrom by a simple washing operation. Examples of suitable materials are described in the above-referred British Pat. No. 1,128,850 incorporated herein by reference. Preferred are the diazo, diazonium salt and azide resists. Included in the photoresist composition may be a resin or a combination of resins, for example, the combination of a Novolak resin with a polyvinyl ether. The photoresist layer is applied to the backing layer 14 by roller coating, spraying or other means known to the art in 100 to 600 or more microns thickness, with 500 microns or one-half mil preferred.

Further examples of suitable photoresist materials are disclosed in U.S. Pat. Nos. 3,046,110; 3,046,118; 3,102,804; 3,130,049; 3,174,860; 3,230,089; 3,264,837; 3,149,983; 3,264,104; 3,288,608; and 3,427,162 and in British Pat specification Nos. 706,028 and 1,128,850 all incorporated herein by reference. A preferred composition is disclosed in copending U.S. Pat. application, Ser. No. 651,700, filed July 17, 1967, in the name of Carl W. Christensen, the formulation disclosed in Example 2 being most preferred.

Other suitable light-sensitive materials include cinnamic acid, vinylcinnomalalacetophenone polymers such as those disclosed in U.S. Pat. No. 2,716,102; vinyl benzal acetophenones as disclosed in U.S. Pat. No. 2,716,103; diazo sulfonates such as those of U.S. Pat. No. 2,854,338; vinylazidophthalate polymers of U.S. Pat. No. 2,870,011; and the like.

In a preferred embodiment, the laminate L may have an adhering layer 4 over the photoresist layer. The adhering layer is a heat- and/or pressure-sensitive material and functions to adhere the laminate to a substrate by application of heat and/or pressure such as by passing the laminate under a heated pressure roll, or by preheating the base material, the film, or both. Heat-sensitive, pressure-sensitive film-forming materials are well known in the art and any of these conventional materials would be suitable for purposes of the present invention. However, it has been found desirable to add a small amount of up to about 10 percent of the photoresist material to the heat-sensitive, pressure-sensitive layer so that it will have developability characteristics similar to those of the photoresist. The acrylic resins, especially methylmethacrylate resins containing about 5 percent by weight photoresist material, are preferred materials for adhering layer 4.

Figure 2:
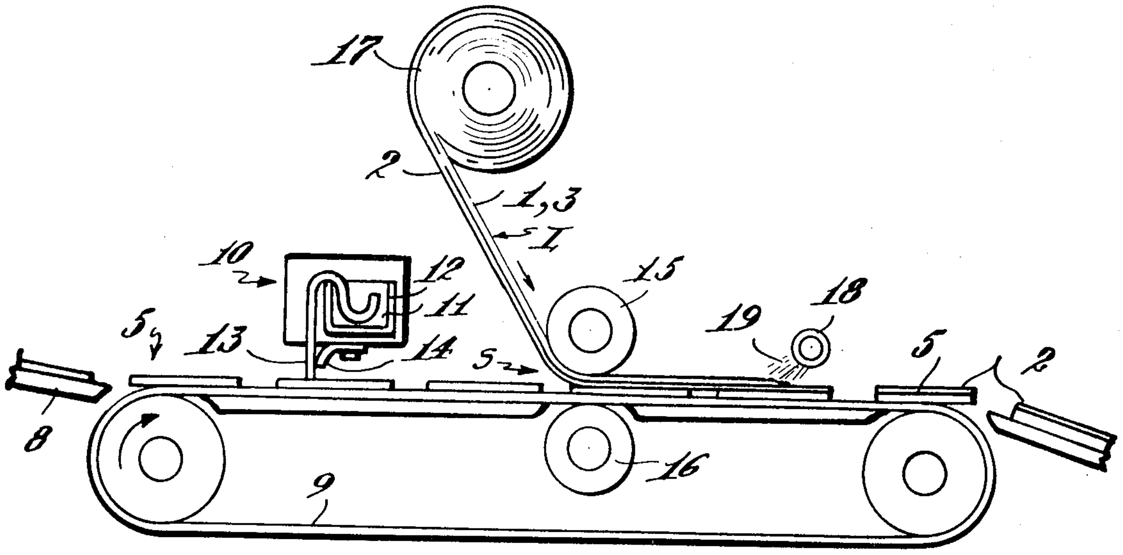
FIG. 2 is a side elevation of one type of apparatus used to apply photoresist according to the invention.
Figure 3:
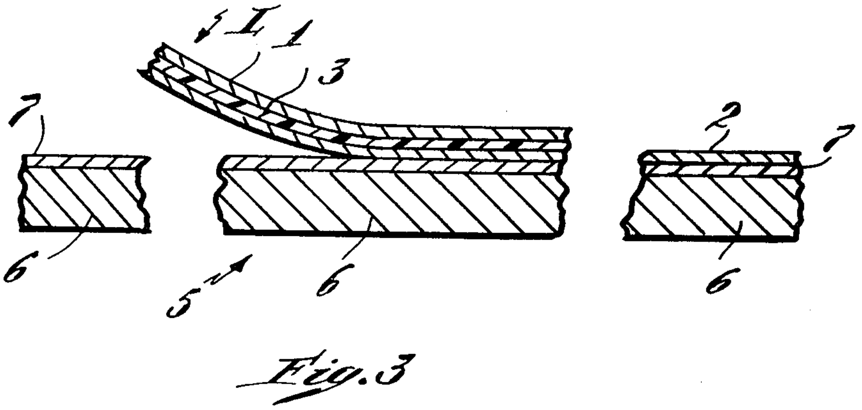
FIG. 3 is an enlarged side sectional view of substrate and light-sensitive laminate with portions removed and some dimensions exaggerated for clarity, showing different stages of the application of photoresists according to the invention.

FIG. 2 illustrates an apparatus of the invention which may be sued to apply photoresist continuously to a succession of precut substrates 5 used as a base material for printed circuit boards. The substrate 5 comprise a layer 6 of plastic, for example, phenolic or ABS, and may be unclad or, as illustrated, clad with a layer of metal 7, for example, copper foil (FIG. 3). The present example of the printed circuit board making, of course, does not exhaust the possible applications of the invention, which find use as well in the graphic arts, the making of decals and nameplates, chemical milling, etching, and in any field in which a photoresist is to be put on a substrate made from whatever composition is expedient.

Substrates 5 are fed from a delivery slide 8 to an endless belt 9, or other transfer means, which transports them to a transfer station S. In advance of the transfer station S, the substrates may be carried past a coating apparatus 10 which applies to the upper surface of the substrate a uniform layer of adhering agent 11. This adhering agent 11 is used when laminate L does not possess the heat-sensitive, pressure-sensitive layer 4 and provides the same or similar function. The composition of adhering agent 11 may be substantially the same as adhering layer 4 except that it is applied in the form of a solution. Where an adhering layer 4 is used, coating apparatus 10 and adhering agent 11 is not necessary.

While the adhering agent 11 may in some cases be a glue like material, it is necessary that the agent later diffuse away or, if it remains, be exposed to produce different solubility characteristics and be dissolved and removed away by the same materials as are used to dissolve and remove the exposed photoresist. The agent, therefore, desirably exhibits photoresist characteristics itself. Though the adhering agent may be simply a solvent for the photoresist, it preferably comprises a material which is a solvent for the particular photoresist to be applied, and contains a small amount of dissolved photoresist, either the same as or compatible with the photoresist in the film.

The purpose of including dissolved photoresist in the adhering agent is to provide a fill for minute irregular surface valleys in the substrate, so that the thickness of the adhered film or photoresist will not be appreciably diminished by "hills" jutting into it. Accordingly, an appropriate amount of dissolved photoresist is approximately equal to the volume of the valleys, such as 0.5 to 5 percent by weight of a solution applied in ten- to twenty-millionths on an inch thickness.

Besides dissolved photoresist, the adhering agent may include small amounts of other additives. One such additive is a material for cleaning the substrate surface to promote a better bond. Where the substrate is copper or another metal foil, the cleaner can be, for example, an organic acid. In many cases, this cleaner may be sufficient to prepare the substrate surface so that pretreating steps, necessary with heat bonding, can be omitted. Another such additive is a material for reducing surface energy of the agent 11 to assist it in fully wetting the surface of the substrate 5 so that air in the surface irregularities will be displaced and no trapped air pockets will be formed. Suitable wetting agents include high molecular weight organic sulfates and sulfonates.

Adhering agent 11 is preferably not too viscous to aid wetting, and is preferably applied in a thin coat to expedite bonding, for example, ten- to twenty-millionths of an inch. These factors and their importance will vary, or course, with particular circumstances and particular types of photoresists.

All types of photoresists have a corresponding solvent which can be used in the adhering agent 11, and therefore, the range of useable photoresists include compositions containing thermoplastics and other polymers. Using heat bonding techniques, the photoresist composition is somewhat limited to thermoplastics, but if the resist is a thermoset, a thermoplastic tackifier or bonding layer may be used. However, heat-bonding is within the scope of the subject invention. As indicated above, many suitable formulations and additives for adhering agent 11 are possible. As an example, if light-sensitive diazo compounds are in the photoresists, a suitable solvent is ethylene glycol monoethyl ether with a suitable percent of photoresist dissolved in it, being about 0.5 to 5 percent by weight.

Coating apparatus 10, as illustrated in FIG. 2, comprises a reservoir 12 containing a supply of adhering agent 11 fed from means (not shown) maintaining a uniform level therein, and a wick 13 with its upper end immersed in the reservoir and its lower end held in form contact with the moving surface of a substrate 5 by means of a leaf spring 14. Wick 13 applies a sufficiently uniform coating of agent 11 to the substrate 5 for purposes of the invention, avoids formation of bubbles, does not cause material to cover or remain in through-holes, and by filling irregularities in the substrate surface, provides a smooth surface for contacting the photoresist film.

Figure 5:
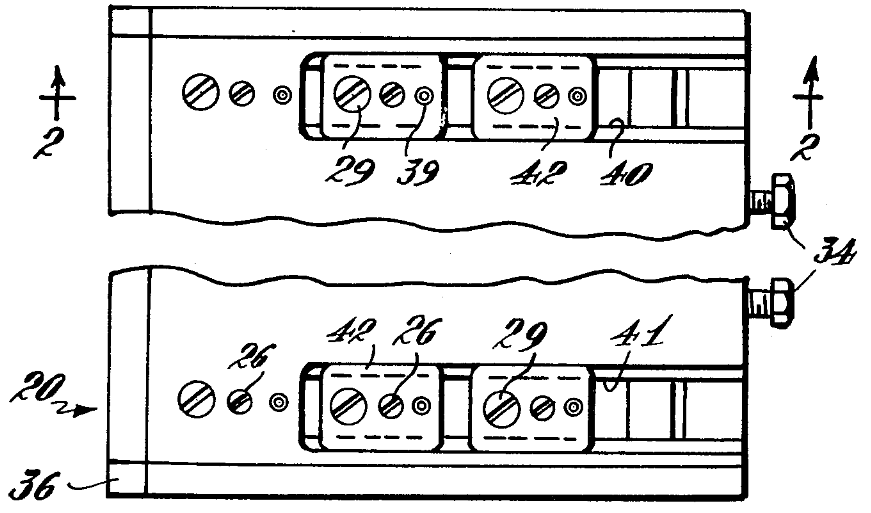
FIG. 5 is a top view of the modified apparatus of FIG. 4.
Figure 4:
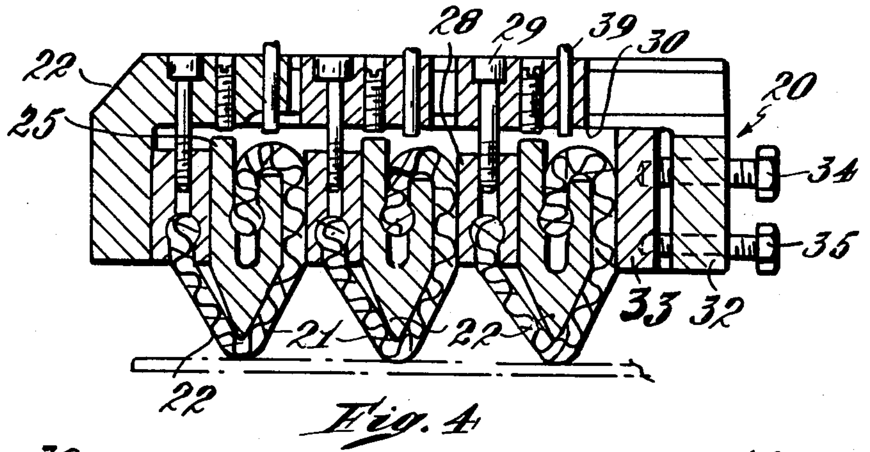
FIG. 4 is a side sectional view of modified applicator apparatus.
Figure 6:
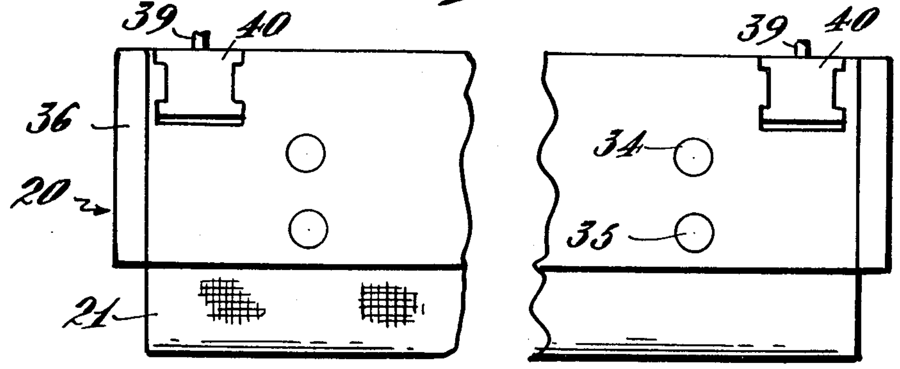
FIG. 6 is an end view of the modified apparatus from the left of FIG. 4.

An improved coating apparatus 20 is illustrated in FIGS. 4 to 6. In this apparatus, means are provided for accurately controlling the capillarity, tension, and position of the applicators which apply adhering agent 11. The apparatus comprises a plurality of wicks 21, here numbering three, mounted within a frame 22. Each wick is formed from a sheet of absorbent material, such as felt, and has enlarged edges 21*a* and 22*b* suitable for gripping. The edges may be provided, for example, by sewing a binding tape in a looped fashion to the edges of the felt and then inserting a rod or dowel of diameter greater than the thickness of the material into the loop. One enlarged end 21*a* of each wick fits within a groove 24 provided in a mounting bar 25. Each mounting bar 25 is substantially U-shaped, with one leg of the U shorter than the other. The wicks 21 are trained over the shorter end of the U and around the bottom thereof for contact with the substrates 5. The longer leg of the mounting bar 25 is connected to the frame 22 by means of adjusting screws 26, which permit the mounting bars to be leveled with respect to the surfaces of substrates 5 to insure firm and uniform contact of the wicks 21 therewith. The other enlarged ends 21*b*, of the wicks are secured in grooves 27 provided in tension bars 28. The tension bars 28 are free to slide vertically and therefore permit the wicks to be tensioned to control their thickness and therefore to control the pressure of the wicks 21 against the substrates 5. The tension bars 28 are secured to the frames 22 by means of threaded bolts 29 which apply the tension force to the tension bar 28. As shown in FIG. 4, the wicks 21, mounting bars 25 and the tension bars 28 lie in stacked relationship with a cavity 30 provided in the frame 22 between frame end pieces 31 and 32. Bearing against the stacked parts is a capillarity adjustment bar 33 which is adapted to squeeze the wick by means of adjustment screws 34 and 35 and frame end piece 32.

So that the force exerted by capillarity bar 33 will be exerted uniformly on each of the wicks 21, it is necessary that the mounting bars 25 and tension bars 28 be free to slide within the frame 22 which further necessitates that adjustment screws 26 and 29 be free to slide within frame 22. In the embodiment shown in FIGS. 4 to 6, the sliding relationship is permitted by means of the following construction: Frame 22 is provided with lengthwise grooves 40 and 41 which slidably hold blocks 42 into which are threaded the adjustment screws 26 and 29 for one end of a wick assembly. The blocks 42 have upper and lower flanges to restrict upward and downward movement, but are free to slide lengthwise for adjustment of capillarities. The capillarity adjustment bars 35 as mentioned previously, squeezes wicks 21 and thereby controls the rate of solvent flow through them and hence the rate to the substrate 5. In the applicator apparatus illustrated in FIGS. 4 to 6, solvent is fed to the wicks 21 by means of a hose 39 from a supply of solvent. The frame 22, as illustrated in FIGS. 5 and 6, comprises not only the end pieces 31 and 32 previously described, but also sidepieces 36 and 37 secured to the main frame portion by means of bolts. The wicks 21, mounting bars 25, tension bars 28, and capillarity adjusting bars 33, are of uniform cross section and extend with their ends adjacent the frame sidepieces 36 and 37. The width of these members will, of course, be selected to suit the range of width of the substrate to which the adhering agent 11 is to be applied. By making use of applicator apparatus 20, it is possible to get a very uniform, full surface coating on the substrates since the wicks can be adjusted to make full contact with the substrates at an appropriate pressure and with appropriate capillarity to feed a proper amount of agent to them. Naturally, by using a plurality of wicks successively touching the surface of substrate 5, the likelihood that a portion of the substrate surface will be uncoated is diminished.

The apparatus above described using wicking means for applying the coating of adhering agent 11 is preferred for reasons stated above. However, other coating means such as roller coating, spraying, or dipping or the like, though less preferred, may be substituted without departing from the scope of the invention.

After they have received a coating of adhering agent 11, the substrates 5 are advanced to transfer station S, where upper and lower pressure rolls 15 and 16 bring the coated substrate into intimate contact with the photosensitive laminate L fed from a supply roll 17. Extremely high pressures needed in heat-bonding are not necessary here; pressures producing full contact are sufficient. However, as discussed above, it is within the scope of this invention to use adhering means other than adhering agent 11, such as adhering layer 4 whereby coating apparatus 10 (FIG. 2) may be dispensed with and pressure roll 15 may be heated to effect heat and pressure bonding.

At transfer station S, the laminate L is brought into contact with the substrate 5 coated with the adhering agent 11 (or adhering layer 4 where applicable) to secure the layer 2 of photoresist to the substrate. The liquid interface of adhering agent 11 acts to lubricate the substrate surface to permit the laminate L, if misguided, to slide and reduce lateral forces at the film and prevent it from wrinkling. The adhering agent softens the surface portion of the photoresist layer 2 to effect a bond with the substrate 5, the adhering agent first causing greater plasticity at the film surface for good micro-bonding and then diffusing into the photoresist layer to solidify the surface portion thereof in bonded contact against the substrate surface. Limited heating to speed diffusion of the solvent is possible. The amount of solvent and dissolved photoresist and other additives, the pressure exerted by rolls 15 and 16, the speed of transport through the rolls, absence or presence of pressure and the amount of heat provided by the rolls or elsewhere at transfer station S and all interrelated variables will affect the quality and speed of bonding to some extent, and obviously they may need to be correlated with the materials used for substrate and photoresist to obtain best performance. Some limits of variables are clearly applicable: for example, the pressure exerted by rolls 15 and 16 must not be so great that a bank of softened photoresist builds up at the nip of the rolls to be forced into through-holes as would occur in conventional roller coating processes.

After adhering the photoresist laminate L to the circuit board base material at transfer station S, the backing layer 1 is washed with a solvent for intermediate layer 3. The solvent penetrates the backing layer to some extent and also undercuts the backing layer (seeps between the backing and resist layers). Thus the intermediate layer 3 is solvated providing for easy removal of backing layer 1 thus leaving behind photoresist layer 2 secured to substrate 5. In the embodiment illustrated in FIG. 2, this washing is accomplished by spraying means 18 which sprays a solvent such as water onto the backing layer to dissolve the intermediate layer. The photoresist-coated substrate 1 continues to be carried by endless belt 9 toward an exit slot.

After photoresist layer 2 is adhered to substrate 5 and the backing layer 1 is removed, the photoresist may be exposed to radiation of suitable wavelengths in the proper image pattern as explained previously. Alternatively, where an optically transmitting backing layer 1 is used, exposure to radiation may take place before the backing layer is removed. At this juncture it should be noted that a material may be optically transmitting without being optically transparent. In this respect paper is optically transmitting though opaque. A lamp casting light through a mask held against the backing layer may be used to expose the photoresist before the backing layer is removed. A higher intensity lamp or longer exposure time is required for opaque backing. In some cases, it may be desirable to print a mask directly on the upper or lower surface of the transparent backing layer to permit dispensing with the mask and to provide a finer image resolution by having the operative mask closer to the photoresist to be exposed.

Instead of washing backing layer 1 promptly after the latter is adhered to the substrate, as illustrated in FIG. 1, it may be desirable to leave a section of the backing layer attached to each substrate to protect the photoresist layer 2 during storage or during an extended delay before imagewise exposure to light is to take place. If the backing layer is optically opaque to exposing radiation, its continued attachment will permit the photoresist-coated substrate to be handled in the radiation without harm. While the opaque backing layer is in place, for example, through-holes can be drilled and plated. It should be noted that while paper is opaque to ordinary light, it does transmit sufficient light at the high intensities used for exposure of photoresist materials to form a latent image in the photoresist material. Consequently, paper makes an ideal backing layer, especially paper filled with a filler such as clay and glazed for a smooth surface.

The process of this invention may be compared to prior art processes as follows:

| Liquid Resist Process | Invention Process |
|---|---|
| Solution preparation | |
| Spray/Dip/Roller-coat | Laminate |
| Air Dry | |
| Oven Dry | Wash to remove backing |
| Expose | Expose |
| Develop | Develop |
| Dye | |
| Wash and Dry | Wash and Dry |
| Post Bake | |
| Etch or Plate | Etch or Plate |
| Strip | Strip |

In the above table, where a transparent backing layer is used, the steps of washing and exposing can be reversed in the second column or can be combined in a single step by washing with a developer. From the above table, it can be seen that the number of steps involved in the process of the invention is fewer than in the prior art processes. More importantly, the coating of photoresist is more uniform and substantially free of voids, even in areas adjacent the through-holes.

Though considerable description has been set forth illustrating the use of an adhering agent 11 to adhere the laminate L to substrate 5, it should be understood that the invention contemplates other means for adhering the laminate to the substrate. For example, heat and pressure may be applied as in conventional heat-bonding procedures. Alternatively, an adhesive layer may be coated over the photoresist layer. The adhesive layer preferably has light-sensitive properties similar to that of the photoresist layer. This may be accomplished by mixing the light-sensitive material with a normally tacky resin such as a polymethylmethacrylate.

EXAMPLE 1

A photosensitive laminate is prepared corresponding to that depicted in FIG. 1 of the drawings. All layers of the laminate were applied by roller coating processes using rollers rotating through a solution of the applicable material. The permeable backing layer was of a high wet strength paper filled with clay and glazed for a smooth surface. The intermediate bonding layer was applied as a 50 percent by weight solids solution of Gantrez An–139 of General Aniline and Film Corporation. This material is a medium viscosity water soluble copolymer of vinyl methyl ether and maleic anhydride. The photoresist layer was applied as about a 20 percent by weight solids solution of AZ–119 Photoresist of Shipley Company. This material comprises a major portion of an alkali soluble phenol formaldehyde Novolak resin and an o-quinone diazide photosensitizer (comprising about one-third of the solids) dissolved in a predominantly butyl Cellosolve solvent. The final adhering layer was applied as a 50 percent by weight solids solution comprised about 40 percent of the o-quinone diazide photosensitizer, and about equal amounts of Acryloid AT–70 of Rohm and Haas Company and DEN–431 of Dow Chemical Company dissolved in a mixture of xylene and Cellosolve Acetate. Acryloid AT–70 is a cross-linking copolymer of acrylic or methacrylic acid and DEN–431 is an epoxy - Novolak thermosetting copolymer.

A copper clad circuit board base material is coated with the so prepared laminate using, for example, the apparatus of FIG. 2 absent the coating means. The laminate is applied to the circuit board base material with the adhering layer face downward in contact with the copper cladding using a roll heated to about 100° C. The backing layer is removed by spraying with water to dissolve the intermediate layer. The backing is then readily removed leaving behind a smooth adherent layer of photoresist.

The coated circuit board base material may be developed by exposure for about 2.5 minutes through a transparency positive or negative, as desired using a carbon arc of an intensity of 2,000 foot candles at a distance of 1 foot as a light source. The exposed coating is then developed by immersion or swabbing with a developer such as aqueous 0.25 N potassium hydroxide, trisodium phosphate, disodium phosphate or triethanolamine. If immersion is employed, it is effected for about 1.5 to 2.5 minutes at a temperature of 70° F. Resolution of the developed image is excellent.

If a positive of the desired circuit pattern in used, the copper exposed by the developing operation is etched away, the photoresist remaining is removed and the exposed copper is metal plated. If a negative of the desired circuit pattern is used, the copper exposed by development is metal coated with a solder mask, the photoresist is removed and exposed copper is etched.

EXAMPLE 2

The procedure of Example 1 is followed, but prior to removal of the backing layer, the circuit board base material with the laminate adhered thereto is exposed for about 5 minutes. Thereafter, the composite is washed with developer to simultaneously develop the resist and dissolve the intermediate layer.

EXAMPLE 3

The procedure of Example 1 is repeated but an adhering agent of the formulation of the adhering layer in solution is used to adhere the laminate to the circuit board base material.

EXAMPLE 4

The procedure of Examples 1 and 2 can be repeated using a circuit board base material free of copper cladding. With a positive image pattern, following exposure and development, the substrate is sensitized using for example, a colloidal solution of palladium such as that of Example 2 of U.S. Pat. No. 3,011,920, the remaining resist is removed and the substrate is metal plated using an electroless copper solution.

EXAMPLE 5

The procedure of Example 1 can be repeated coating a photosensitive composition identified as Dynachem Photo Resist (DCR) manufactured by Dynachem onto the backing layer in place of the AZ–119 resist.

EXAMPLE 6

Repeat procedure of Example 1 drilling through-holes subsequent to adhering the laminate to the circuit board base material and prior to removing the backing layer of the laminate.

We claim:

1. The method of applying a layer of an unexposed photoresist to a substrate comprising:

providing an unexposed light-sensitive laminate having a permeable backing layer, a photoresist layer and an intermediate layer displaced between the permeable backing layer and the photoresist layer, said photoresist layer and said permeable backing layer being adhered to each other through said intermediate layer, and said intermediate layer being soluble or degraded in water or aqueous developer for said photoresist layer and said backing layer being substantially insoluble in water or said aqueous developer;

adhering said unexposed light-sensitive laminate to said substrate with said photoresist layer in contact with said substrate; and removing said backing layer by washing with water or aqueous developer for said photoresist to dissolve or degrade the intermediate bonding layer thereby releasing the backing layer.

2. The process of claim 1 where the adhering agent or layer has light-sensitive properties.

3. The light-sensitive laminate of claim 1 where said photoresist layer comprises an azide light-sensitive material.

4. The light-sensitive laminate of claim 3 adhered to a substrate.

5. The light-sensitive laminate of claim 4 where said substrate is unclad plastic or copper clad plastic.

6. The light-sensitive laminate of claim 4 where said light-sensitive laminate is adhered to said substrate through a layer of adhesive containing a minor amount of said photoresist material.

7. The light-sensitive laminate of claim 3 where the backing layer is paper.

8. The light-sensitive laminate of claim 7 where said backing layer is paper filled with clay and glazed.

9. The light-sensitive laminate of claim 3 where the intermediate layer is of a water soluble material selected from the group of dextrine, gum arabic, mesquite gum, water soluble salt selected from the group of pectic acid and alginic acid, water soluble cellulose ether, water soluble salt of carboxy alkyl cellulose, water soluble salt of carboxy alkyl starch, glue, albumen, peptin, water soluble caseinate, polyvinyl alcohol, polyvinyl pyrrolidone, polyacrylamide, water soluble salt of polyacrylic acid, gelatin, starch, ethylene oxide polymer, high molecular weight saccharides and copolymers of a polyvinyl ether and maleic anhydride.

10. The light-sensitive laminate of claim 3 having a layer of a heat-sensitive or heat- and pressure-sensitive material over said photoresist layer.

11. The method of claim 1 where said photoresist layer comprises an azide light-sensitive material.

12. The method of claim 11 where said light-sensitive laminate is adhered to the substrate by applying a uniform coat of liquid adhering agent for said photoresist to a surface of said substrate, said adhering agent comprising a solvent for said photoresist, and contacting said light-sensitive laminate to said coated surface with said photoresist layer and said adhering agent together to effect adhesion of said photoresist to said substrate.

13. The method of claim 11 where said light-sensitive laminate is adhered to the substrate by applying an adhering layer or a pressure-sensitive or heat- and pressure-sensitive material over said photoresist layer and adhering said adhering layer to said substrate by application of heat and pressure.

14. The process of claim 11 where the permeable backing layer is paper having its surface filled with clay and glazed for a smooth surface.

15. A light-sensitive laminate comprising a permeable backing layer, a photoresist layer and an intermediate layer displaced between said permeable backing layer and said photoresist layer, said intermediate layer being soluble or degradable in water or aqueous developer for said photoresist layer and said backing layer being substantially insoluble in water or said developer.

* * * * *